(12) United States Patent
Murayama et al.

(10) Patent No.: US 7,301,181 B2
(45) Date of Patent: Nov. 27, 2007

(54) HETEROJUNCTION BIPOLAR TRANSISTOR HAVING AN EMITTER LAYER MADE OF A SEMICONDUCTOR MATERIAL INCLUDING ALUMINUM

(75) Inventors: Keiichi Murayama, Okayama (JP); Yorito Ota, Kobe (JP); Akiyoshi Tamura, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/980,254

(22) Filed: Nov. 4, 2004

(65) Prior Publication Data

US 2005/0199909 A1    Sep. 15, 2005

(30) Foreign Application Priority Data

Mar. 9, 2004    (JP) ............................. 2004-065353

(51) Int. Cl.
 *H01L 31/0328* (2006.01)
(52) U.S. Cl. ...................... 257/197; 257/192; 257/194; 257/195; 257/198
(58) Field of Classification Search ................ 257/197, 257/198, 192, 194, 195, 280, 281
See application file for complete search history.

(56) References Cited

U.S. PATENT DOCUMENTS 5,859,447 A * 1/1999 Yang et al. ................. 257/197

2002/0145153 A1* 10/2002 Yamada et al. ............ 257/183
2003/0222278 A1    12/2003 Liu et al.

FOREIGN PATENT DOCUMENTS

JP          5-36713        2/1993
JP          8-241896       9/1996

* cited by examiner

*Primary Examiner*—Evan Pert
*Assistant Examiner*—Tan Tran
(74) *Attorney, Agent, or Firm*—Wenderoth, Lind & Ponack, L.L.P.

(57) ABSTRACT

The present invention aims at providing a heterojunction bipolar transistor having improved breakdown voltage on operation for high power output, and includes: a GaAs semiconductor substrate 100; an $n^+$-type GaAs sub-collector layer 110; an n-type GaAs collector layer 120; a p-type GaAs base layer 130; an emitter layer 140; an n-type GaAs emitter cap layer 150; and an n-type InGaAs emitter contact layer 160. The emitter layer 140 has a multilayer structure including an n-type or non-doped first emitter layer 141 and an n-type second emitter layer 142 which are laminated in sequence. The first emitter layer 141 is made of a semiconductor material including Al, while the second emitter layer 142 is made of $In_xGa1-xP$ ($0<x<1$).

5 Claims, 6 Drawing Sheets

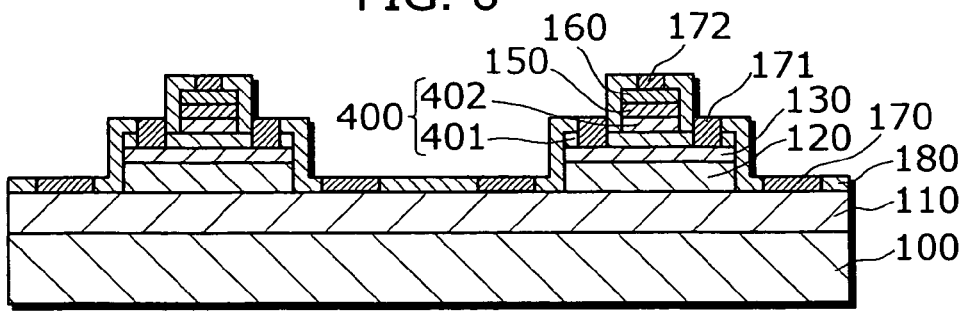

US 7,301,181 B2

HETEROJUNCTION BIPOLAR TRANSISTOR HAVING AN EMITTER LAYER MADE OF A SEMICONDUCTOR MATERIAL INCLUDING ALUMINUM

BACKGROUND OF THE INVENTION (1) Field of the Invention

The present invention relates to a heterojunction bipolar transistor and its manufacturing method.

(2) Description of the Related Art

A heterojunction bipolar transistor (hereinafter referred to as HBT) using a semiconductor of a large bandgap as an emitter has gained attention as a high-frequency analog device used for a cell phone and the like. Particularly, an InGaP/GaAs HBT using InGaP as an emitter has been commercially utilized as a device with high performance and high reliability because it has the following advantages: lower dependency on temperature of a current amplification factor (HFE) because of large valence band discontinuity ($\Delta Ev$); and less recombination current in the base because of no existence of the interface trapped density nor the DX center (See, for example, Japanese Laid-Open Patent Application Publication H5-36713 and Japanese Laid-Open Patent Application Publication H8-241896).

The device structure and its manufacturing method of a common InGaP/GaAs HBT will be explained below with reference to the drawings.

FIG. 1 is a cross-sectional view showing a structure of an InGaP/GaAs HBT.

As shown in FIG. 1, the InGaP/GaAs HBT has a multi-layer structure including the following layers formed on a semi-insulating GaAs semiconductor substrate 800 in the following order: an $n^+$-type GaAs sub-collector layer 810 formed by doping an n-type dopant with high concentration; an n-type GaAs collector layer 820 with low dopant concentration; a p-type GaAs base layer 830 with high dopant concentration; an n-type InGaP emitter layer 840; an n-type GaAs emitter cap layer 850; and an n-type InGaAs emitter contact layer 860 for forming an emitter electrode with low contact resistance.

Collector electrode 870, made of AuGe/Ni/Au or the like, for example, is formed on the sub-collector layer 810, a base electrode 871, made of a multilayer metal or the like including Pt, for example, is formed on the emitter layer 840 by diffusing thermally so as to come into contact with the base layer 830, and an emitter electrode 872, made of Ti/Pt/Au or the like, for example, is formed on the emitter contact layer 860.

Insulating film 880, made of $SiO_2$, SiN or the like, is formed on the exposed surface, where the electrodes are not formed, of the sub-collector layer 810, the collector layer 820, the base layer 830, the emitter layer 840, the emitter cap layer 850 and the emitter contact layer 860.

FIG. 2A to FIG. 2D are cross-sectional views for explaining the manufacturing method of the HBT with the above structure.

First, as shown in FIG. 2A, the sub-collector layer 810, the collector layer 820, the base layer 830, the emitter layer 840, the emitter cap layer 850 and the emitter contact layer 860 are laminated on the semiconductor substrate 800 in this order.

Next, as shown in FIG. 2B, the emitter contact layer 860 and the emitter cap layer 850 are removed by wet etching using a mixed solution of phosphoric acid, hydrogen peroxide and water until the emitter layer 840 is exposed. As a result, an emitter island is formed.

Next, as shown in FIG. 2C, the emitter layer 840, the base layer 830 and the collector layer 820 are removed in this order by etching until the sub-collector layer 810 is exposed. As a result, a base island is formed.

Next, as shown in FIG. 2D, after the insulating film 880 is deposited over the surfaces of the emitter island, the base island and the sub-collector layer 810, contact windows that correspond to the emitter electrode, base electrode and collector electrode are opened. Then, the emitter electrode 872 is formed in the emitter contact window, the base electrode 871 is formed in the base contact window, and the collector electrode 870 is formed in the collector contact window. The InGaP/GaAs HBT is manufactured in the manner as mentioned above.

By the way, the applicability of the InGaP/GaAs-system HBT has been widened in recent years, and there is a demand for the HBT to have the characteristic of high power outputs. For example, as for a transmission amplifier of a cell phone particularly, the high power output of 3 to 4 W is especially required when the HBT is commercially utilized as a power device of a terminal transmitter of the GSM-system but not of the conventional CDMA-system.

However, there is a problem that a conventional InGaP/GaAs HBT breaks down more easily on higher power output.

Here, the breakdown of the HBT on operation for high power output will be explained below.

FIG. 5 is a diagram showing the $V_c$ (collector voltage)–$I_c$ (collector current) characteristics and breakdown voltage curve of the conventional InGaP/GaAs HBT. It should be noted that, in FIG. 5, dashed lines indicate the $V_c$–$I_c$ characteristics of the conventional HBT at different base currents $I_B$, while a dotted line indicates a breakdown voltage curve which is drawn by plotting the points at which the HBT is broken at respective base currents $I_B$ on high power output. In this diagram, the left side of the breakdown voltage curve is an area called a safe operation area (SOA).

FIG. 5 shows that the HBT is broken down on operation for high power output at the moment when the operation points of the HBT go beyond the SOA, namely, when the operation curves and the breakdown voltage curve intersect with each other. This breakdown is caused by sudden increase in $I_c$ at a specific $V_c$, and this phenomenon in which $I_c$ increases suddenly at the specific $V_c$ is called avalanche multiplication.

SUMMARY OF THE INVENTION

In view of the foregoing problem, it is the object of the present invention to provide a heterojunction bipolar transistor having improved breakdown voltage on operation for high power output.

In order to achieve the above object, the heterojunction bipolar transistor according to the present invention includes: an n-type collector layer made of GaAs; a p-type base layer made of GaAs and formed on the collector layer; an n-type or non-doped first emitter layer formed on the base layer; and an n-type second emitter layer formed on the first emitter layer, wherein the first emitter layer is made of a semiconductor material including aluminum, and the second emitter layer is made of $In_xGa_{1-x}P$ (0<x <1). Here, the first emitter layer may be made of an aluminum oxide.

According to this structure, there exists a semiconductor layer with a lot of DX centers between the emitter layer and the base layer, which allows increase in recombination current and thus allows increase in base leakage current. Therefore, it is possible to realize a heterojunction bipolar transistor whose breakdown caused by avalanche multiplication on operation for high power output is suppressed and thus breakdown voltage on operation for high power output is improved.

Here, the first emitter layer may have a thickness in a range from 3 nm to 10 nm inclusive.

According to this structure, it is possible to make the best use of the good effect of the semiconductor material including Al on the breakdown voltage on the operation of the HBT for high power output, while suppressing to a minimum the adverse effect of the semiconductor material including Al on the performance and reliability of the HBT. Therefore, it is possible, according to the present embodiment, to realize a heterojunction bipolar transistor having improved breakdown voltage on operation for high power output, while making full use of the advantageous characteristics of the InGaP/GaAs HBT with high performance and high reliability.

Additionally, the second emitter layer may be formed on the base layer, covering the first emitter layer.

According to this structure, the base electrode is formed on the second emitter layer made of InGaP so as to come in ohmic contact with the base layer. Therefore, it is possible to reduce the recombination current in the base, compared with the case where the base electrode is formed on the semiconductor layer made of AlGaAs at a high surface recombination rate so as to come in ohmic contact with the base layer, and thus to realize a heterojunction bipolar transistor with high performance and high reliability.

Furthermore, the heterojunction bipolar transistor according to the present invention may include: an n-type collector layer made of GaAs; a p-type base layer made of GaAs and formed on the collector layer; an n-type second emitter layer formed on the base layer; and an n-type or non-doped first emitter layer formed on the second emitter layer, wherein the first emitter layer is made of a semiconductor material including aluminum, and the second emitter layer is made of $In_xGa_{1-x}P$ (0<x<1) and has a thickness in a range from 3 nm to 15 nm inclusive.

According to this structure, it is possible to make the best use of the good effect of InGaP on the performance and reliability of the HBT as well as the good effect of the semiconductor material including Al on the breakdown voltage on the operation of the HBT for high power output. Therefore, it is possible to realize a heterojunction bipolar transistor having improved breakdown voltage on operation for high power output while making full use of the advantageous characteristics of the InGaP/GaAs HBT with high performance and high reliability.

Here, the first emitter layer may be made of $Al_yGa_{1-y}As$ (0<y<1).

According to this structure, discontinuity between emitter-base valence bands becomes smaller, which allows increase in temperature dependency of HFE. Therefore, it is possible to realize a heterojunction bipolar transistor whose HFE on operation for high power output is decreased and thus breakdown voltage on operation for high power output is improved.

Furthermore, it is possible to embody the present invention as a method for manufacturing a heterojunction bipolar transistor, comprising: laminating an n-type collector layer made of GaAs and a p-type base layer made of GaAs in sequence on a semiconductor substrate; forming an n-type or non-doped first emitter layer on a predetermined area of the base layer, the first emitter layer being made of a semiconductor including aluminum; and forming an n-type second emitter layer on an area other than the predetermined area of the base layer and over the first emitter layer, the second emitter layer being made of $In_xGa_{1-x}P$ (0<x<1). Here, the first emitter layer may be made of $Al_yGa_{1-y}As$ (0<y<1).

According to this method, the base electrode is formed on the second emitter layer which is made of InGaP so as to come in ohmic contact with the base layer, which allows reduction of the recombination current in the base. Therefore, it is possible to realize a manufacturing method of a heterojunction bipolar transistor with high performance and high reliability.

As is clear from the above description, according to the present invention, it is possible to realize a heterojunction bipolar transistor having improved breakdown voltage on operation for high power output. It is also possible to realize a heterojunction bipolar transistor with high performance and high reliability.

Consequently, according to the present invention, it becomes possible to provide a heterojunction bipolar transistor having improved breakdown voltage on operation for high power output, and thus realize a heterojunction bipolar transistor that can be commercially used as a power device for a GSM-system terminal transmitter.

As further information about technical background to this application, the disclosure of Japanese Patent Application No. 2004-065353 filed on Mar. 9, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 6 is a cross-sectional view showing a structure of an HBT in a second embodiment of the present invention;

FIG. 7A to FIG. 7D are cross-sectional views for explaining a manufacturing method of the HBT in the second embodiment;

DESCRIPTION OF THE PREFERRED EMBODIMENT(S)

The heterojunction bipolar transistor (HBT) according to the embodiments of the present invention will be described below with reference to the drawings.

First Embodiment

Figure 1:
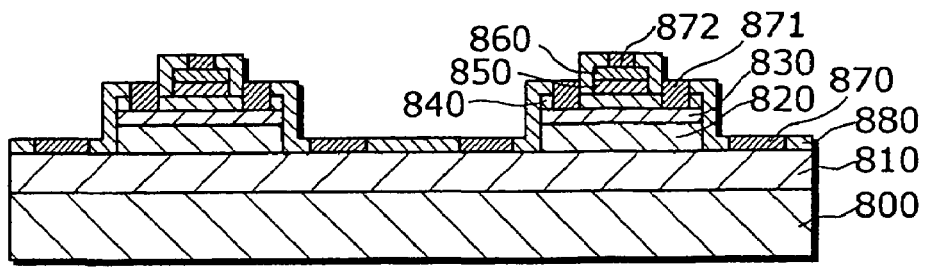
FIG. 1 is a cross-sectional view showing a structure of a conventional HBT.
Figure 2A:
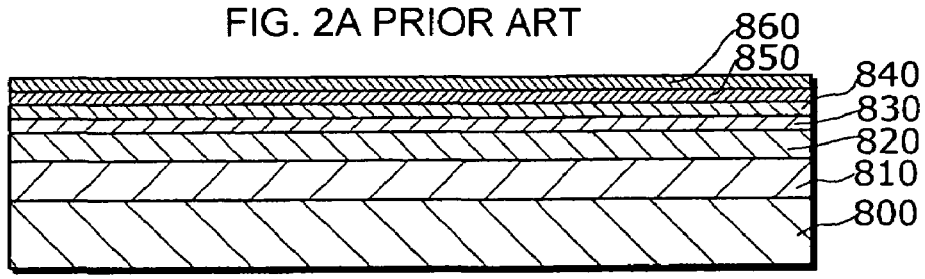
FIG. 2A to FIG. 2D are cross-sectional views for explaining a manufacturing method of the conventional HBT.
Figure 2B:
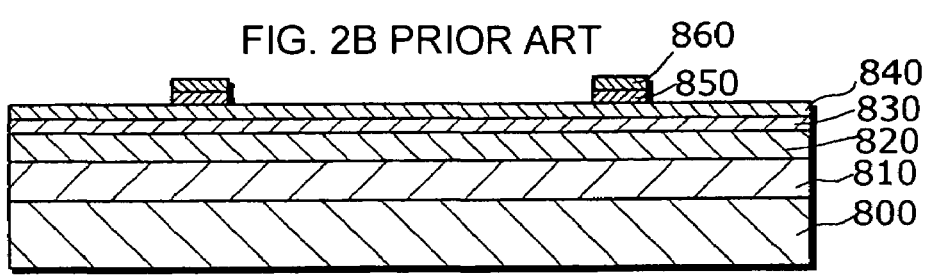
Figure 2C:
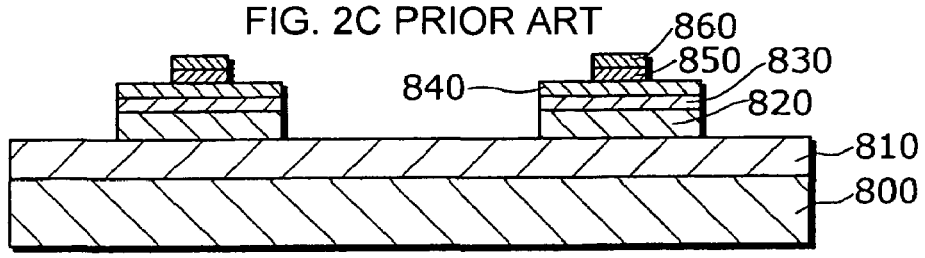
Figure 2D:
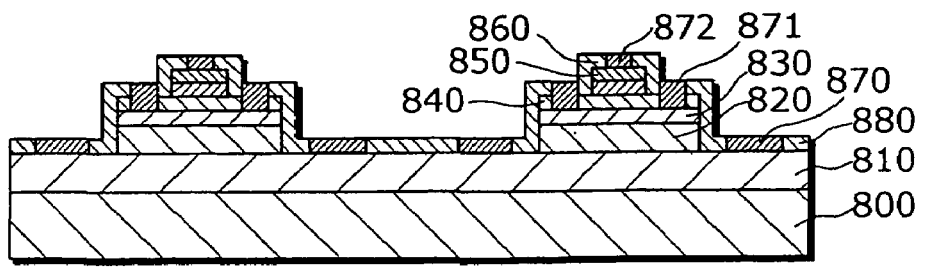
Figure 3:
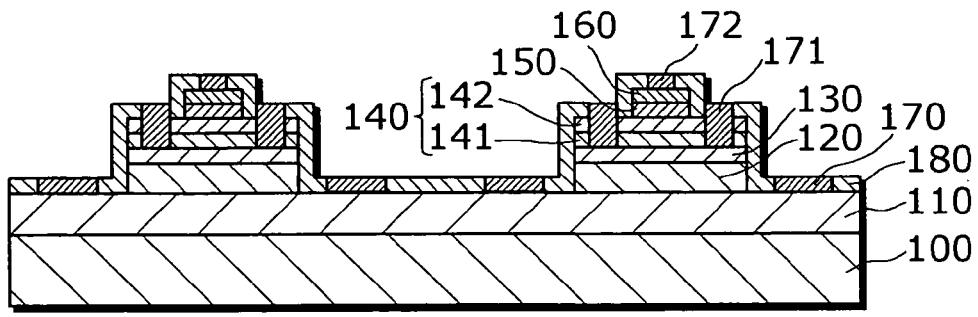
FIG. 3 is a cross-sectional view showing a structure of an HBT in a first embodiment of the present invention.

FIG. 3 is a cross-sectional view showing a structure of the HBT in the first embodiment.

The HBT of the present embodiment aims at realizing an HBT having improved breakdown voltage on operation for high power output. This HBT has a multilayer structure including the following layers formed on a semi-insulating GaAs semiconductor substrate 100 in the following order: an n+-type GaAs sub-collector layer 110 formed by doping an n-type dopant with high concentration; an n-type GaAs collector layer 120 with low dopant concentration; a p-type GaAs base layer 130 formed by doping a p-type dopant such as C with high concentration; an emitter layer 140; an n-type GaAs emitter cap layer 150; and an n-type InGaAs emitter contact layer 160 for forming an emitter electrode with low contact resistance.

The emitter layer 140 includes a first emitter layer 141 and a second emitter layer 142 which are laminated on the base layer 130 in this order. Here, the first emitter layer 141 is a non-doped or n-type layer made of a semiconductor material including Al, while the second emitter layer 142 is an n-type layer, with the thickness of 20 to 50 nm, for example, made of $In_xGa_{1-x}P$ with In composition of about 50%. The semiconductor material including Al used for the first emitter layer 141 is an Al oxide, $Al_yGa_{1-y}As$ with Al composition of about 10 to 15%, or the like, for example.

Here, the thickness of the first emitter layer 141 shall be 10 nm or less because the first emitter layer 141 with the thickness of more than 10 nm has too much effect on the emitter layer 140, and thus has much adverse effect on the performance and reliability of the HBT due to increase in recombination current or the like. In addition, the thickness of the first emitter layer 141 shall be 3 nm or more because the first emitter layer 141 with the thickness of less than 3 nm has too little effect on the emitter layer 140, and thus has little good effect on the breakdown voltage on the operation of the HBT for high power output due to increase in recombination current or the like.

A collector electrode 170, made of AuGe/Ni/Au or the like, for example, is formed on the sub-collector layer 110, a base electrode 171, made of a multilayer metal or the like including Pt, for example, is formed on the second emitter layer 142 by diffusing thermally so as to come into contact with the base layer 130, and an emitter electrode 172, made of Ti/Pt/Au or the like, for example, is formed on the emitter contact layer 160.

Insulating film 180, made of $SiO_2$, SiN or the like, is formed on the exposed surface, where the electrodes are not formed, of the sub-collector layer 110, the collector layer 120, the base layer 130, the emitter layer 140, the emitter cap layer 150 and the emitter contact layer 160.

Next, a manufacturing method of the HBT with the structure as mentioned above will be explained below with reference to the cross-sectional views in FIG. 4A to FIG. 4D. It should be noted that the same reference numbers are assigned to the same components as those in FIG. 3, and the detailed explanation thereof is not repeated here.

Figure 4A:
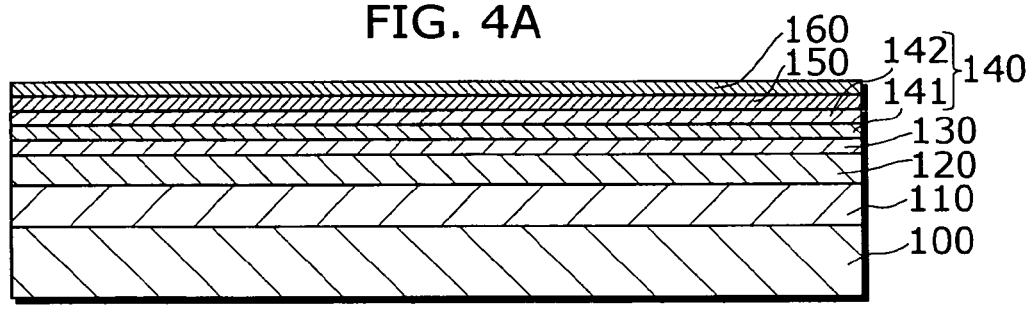
FIG. 4A to FIG. 4D are cross-sectional views for explaining a manufacturing method of the HBT in the first embodiment.

First, as shown in FIG. 4A, by a crystal growth method like the molecular-beam epitaxial (MBE) method or the metal organic chemical vapor deposition (MOCVD) method, the following layers are laminated on the semiconductor substrate 100 in the following order: the sub-collector layer 110; the collector layer 120; the base layer 130; the first emitter layer 141; the second emitter layer 142; the emitter cap layer 150; and the emitter contact layer 160.

Figure 4B:
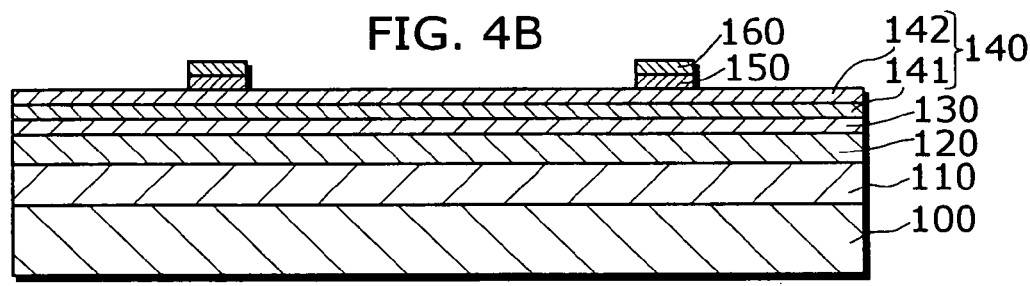

Next, as shown in FIG. 4B, after a pattern for forming the emitter island is formed using a photoresist, the emitter contact layer 160 and the emitter cap layer 150 are etched in sequence using a mixed solution of phosphoric acid, hydrogen peroxide and water, so as to form the emitter island. In this process, the second emitter layer 142 is hardly etched.

Figure 4C:
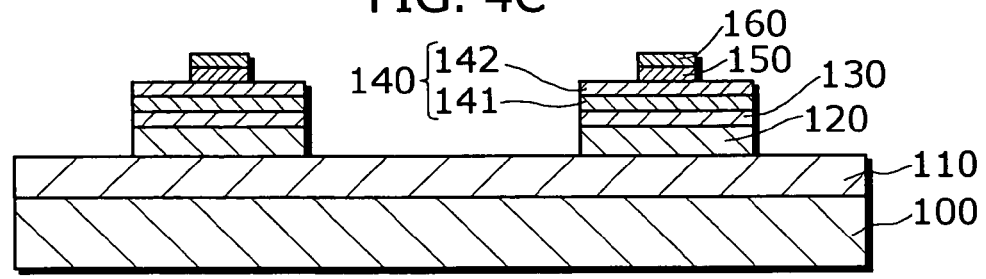

Next, as shown in FIG. 4C, after a pattern for forming the base island is formed using a photoresist, the second emitter layer 142 is selectively etched using hydrochloric acid diluted with water. Then, using the etched second emitter layer 142 as a mask, the first emitter layer 141, the base layer 130 and the collector layer 120 are etched in sequence using a mixed solution of phosphoric acid, hydrogen peroxide and water, so as to form the base island.

Figure 4D:
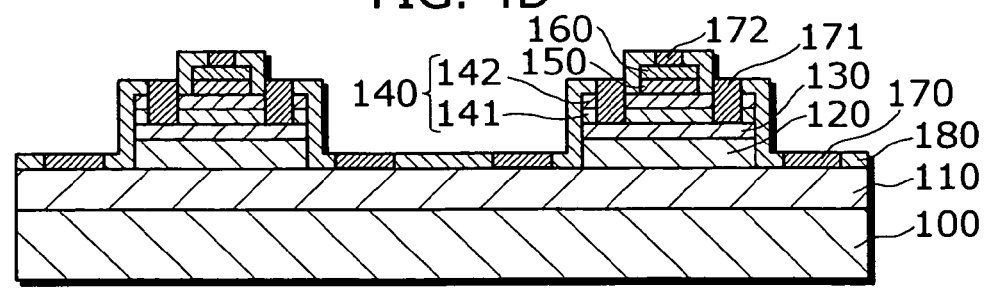

Next, as shown in FIG. 4D, after the insulating film 180 is deposited all over the surface, contact windows that correspond to the collector electrode 170, the base electrode 171 and the emitter electrode 172 are opened, and then, the electrode metals are formed in the respective windows. The HBT in the present embodiment is manufactured in this manner.

Next, the electrical characteristics of the HBT with the above-mentioned structure will be described.

Figure 5:
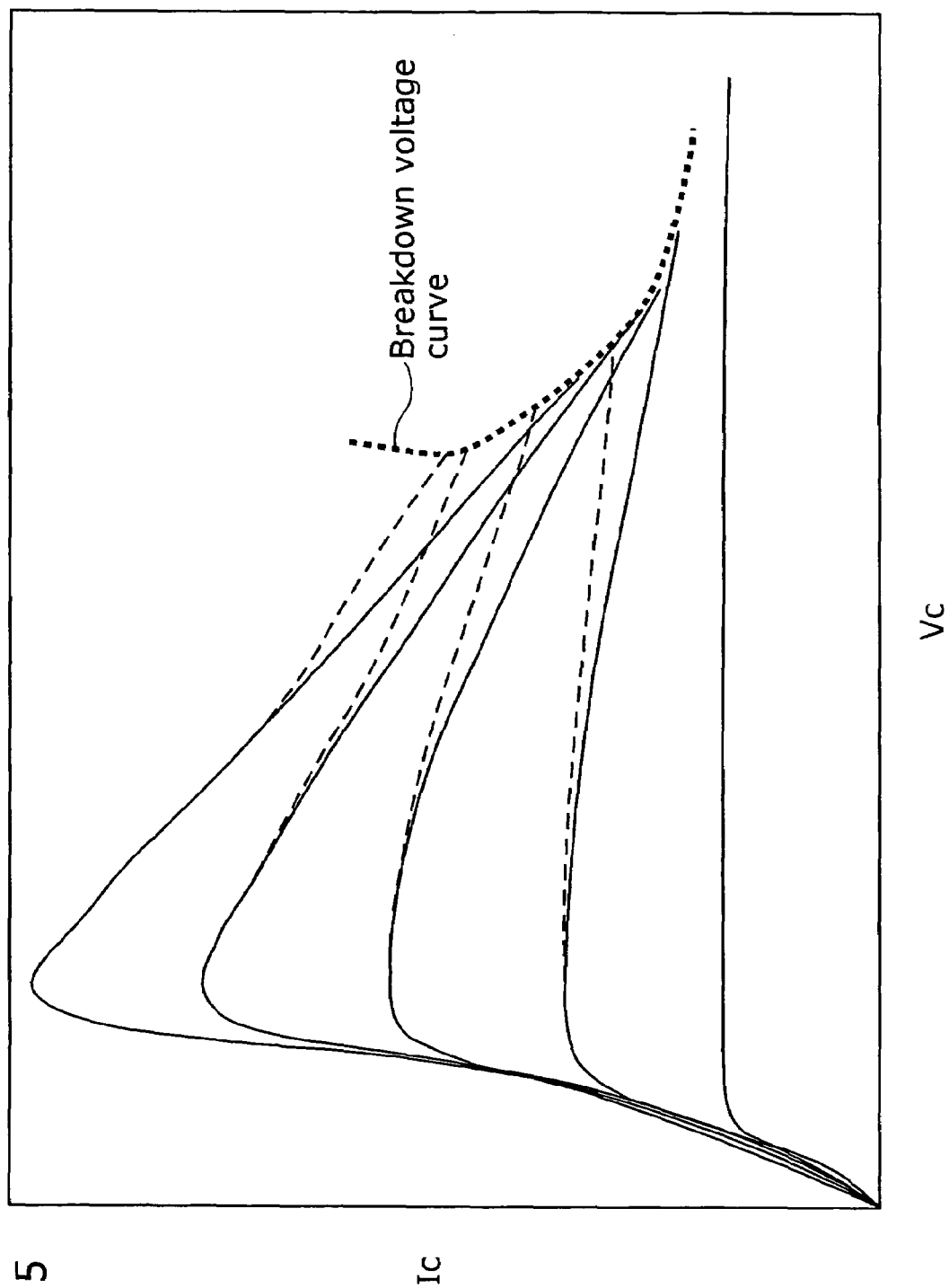
FIG. 5 is a diagram showing the $V_c$–$I_c$ characteristics and breakdown voltage curve of the HBT in the first embodiment and the conventional HBT.

FIG. 5 is a diagram showing the $V_c$–$I_c$ characteristics and the breakdown voltage curve. It should be noted that, in FIG. 5, solid lines and dashed lines indicate the $V_c$–$I_c$ characteristics of the HBT in the present embodiment and the conventional HBT at different base currents $I_B$, while a dotted line indicates a breakdown voltage curve which is drawn by plotting the points at which these HBTs are broken at respective base currents $I_B$ on high power output. In this diagram, the left side of the breakdown voltage curve is an area called a safe operation area (SOA). This graph shows the case where $Al_yGa_{1-y}As$ is used as a semiconductor material including Al for the first emitter layer 141.

FIG. 5 shows that, as for the HBT in the present embodiment, the values of $V_c$, at which the operation points thereof go beyond the SOA, namely, the operation curves and the breakdown voltage curve intersect with each other, are higher than the values of $V_c$ of the conventional HBT. This means that the breakdown voltage of the HBT in the present embodiment is higher than that of the conventional HBT. This is attributed to the fact that AlGaAs, which has less valence band discontinuity with GaAs than InGaP, is used for the emitter layer. More specifically, in the HBT in the present embodiment, since the temperature dependency of HFE is larger than that of the conventional HBT, the decrease in HFE caused by the increase in temperature of a device on operation for high power output is more dominant, and thus the slope of the operation curve is steeper.

As described above, according to the HBT in the present embodiment, the emitter layer 140 includes the first emitter layer 141 which is made of a semiconductor material including Al, and is formed on the p-type GaAs base layer 130. In other words, the HBT in the present embodiment has a semiconductor layer with a lot of DX centers between the emitter layer and the base layer, which allows increase in recombination current and thus increase in base leakage current. Therefore, it is possible, according to the present embodiment, to realize an HBT whose breakdown caused by avalanche multiplication on operation for high power output is suppressed and thus breakdown voltage on operation for high power output is improved.

In addition, according to the HBT in the present embodiment, the emitter layer 140 includes the first emitter layer 141 which is made of $Al_yGa_{1-y}As$, for example, and is formed on the p-type GaAs base layer 130. Therefore, discontinuity between emitter-base valence bands becomes small, which allows increase in temperature dependency of HFE. In other words, it is possible, according to the present embodiment, to realize an HBT whose HFE on operation for high power output is decreased and thus breakdown voltage on operation for high power output is improved.

In addition, according to the HBT in the present embodiment, the emitter layer 140 includes the first emitter layer 141 which is made of a semiconductor material including Al and the second emitter layer 142 which is made of $In_xGa_{1-x}P$, and the thickness of the first emitter layer 141 is a range between 3 and 10 nm. Therefore, it is possible to make the best use of the good effect of the semiconductor material including Al on the breakdown voltage on the operation of the HBT for high power output, while suppressing to a minimum the adverse effect of the semiconductor material including Al on the performance and reliability of the HBT. In other words, it is possible, according to the present embodiment, to realize an HBT having improved breakdown voltage on operation for high power output, while making full use of the advantageous characteristics of the InGaP/GaAs HBT with high performance and high reliability.

Furthermore, according to the HBT in the present embodiment, the second emitter layer 142 is made of $In_xGa_{1-x}P$ and functions as a stopper layer for forming the emitter island. Therefore, it is possible, according to the present embodiment, to realize an HBT that allows etching with higher accuracy for forming the emitter island.

Second Embodiment

FIG. 6 is a cross-sectional view showing a structure of the HBT in the second embodiment. The same reference numbers are assigned to the same components as those in FIG. 3, and the detailed explanation thereof is not repeated here.

The HBT in the present embodiment has a multilayer structure including the following layers formed on the semiconductor substrate 100 in the following order: the sub-collector layer 110; the collector layer 120; the base layer 130; and an emitter layer 400; the emitter cap layer 150; and the emitter contact layer 160.

The emitter layer 400 includes a second emitter layer 401 and a first emitter layer 402 which are laminated on the base layer 130 in this order. Here, the second emitter layer 401 is an n-type layer which is made of $In_xGa_{1-x}P$ with In composition of about 50%, while the first emitter layer 402 is a non-doped or n-type layer which is made of a semiconductor material including Al. Here, the semiconductor material including Al used for the first emitter layer 402 is an Al oxide, $Al_yGa_{1-y}As$ with Al composition of about 10 to 15%, or the like, for example.

Here, the thickness of the second emitter layer 401 shall be 15 nm or less, preferably 7 nm or less, because the holes cannot tunnel through the valence band of the second emitter layer 401 with the thickness of more than 15 nm, particularly more than 7 nm, the first emitter layer 402 has too little effect on the emitter layer 400, and thus has little good effect on the breakdown voltage on the operation of the HBT for high power output due to increase in recombination current or the like. In addition, the thickness of the second emitter layer 401 shall be 3 nm or more because the second emitter layer 401 with the thickness of less than 3 nm has too little effect on the emitter layer 400, and thus has little good effect on the performance and reliability of the HBT due to decrease in recombination current or the like.

The collector electrode 170 is formed on the sub-collector layer 110, the base electrode 171 is formed on the second emitter layer 401 by diffusing thermally so as to come into contact with the base layer 130, and the emitter electrode 172 is formed on the emitter contact layer 160.

The insulating film 180 is formed on the exposed surface, where the electrodes are not formed, of the sub-collector layer 110, the collector layer 120, the base layer 130, the emitter layer 400, the emitter cap layer 150 and the emitter contact layer 160.

Next, a manufacturing method of the HBT with the structure as mentioned above will be explained below with reference to the cross-sectional views in FIG. 7A to FIG. 7D. It should be noted that the same reference numbers are assigned to the same components as those in FIG. 6, and the detailed explanation thereof is not repeated here.

First, as shown in FIG. 7A, by a crystal growth method like the MBE method or the MOCVD method, the following layers are laminated on the semiconductor substrate 100 in the following order: the sub-collector layer 110; the collector layer 120; the base layer 130; the second emitter layer 401; the first emitter layer 402; the emitter cap layer 150; and the emitter contact layer 160.

Next, as shown in FIG. 7B, after a pattern for forming the emitter island is formed using a photoresist, the emitter contact layer 160, the emitter cap layer 150 and the first emitter layer 402 are etched in sequence using a mixed solution of phosphoric acid, hydrogen peroxide and water, so as to form the emitter island. In this process, the second emitter layer 401 is hardly etched.

Next, as shown in FIG. 7C, after a pattern for forming the base island is formed using a photoresist, the second emitter layer 401 is selectively etched using hydrochloric acid diluted with water. Then, using the etched second emitter layer 401 as a mask, the base layer 130 and the collector layer 120 are etched in sequence using a mixed solution of phosphoric acid, hydrogen peroxide and water, so as to form the base island.

Next, as shown in FIG. 7D, after the insulating film 180 is deposited all over the surface, contact windows that correspond to the collector electrode 170, the base electrode 171 and the emitter electrode 172 are opened, and then, the electrode metals are formed in the respective windows. The HBT in the present embodiment is manufactured in this manner.

As described above, according to the HBT in the present embodiment, the emitter layer 400 includes the second emitter layer 401 which is made of $In_xGa_{1-x}P$ and the first emitter layer 402 which is made of a semiconductor material including Al, and the thickness of the second emitter layer 401 is a range between 3 and 15 nm. Therefore, it is possible to make the best use of the good effect of $In_xGa_{1-x}P$ on the performance and reliability of the HBT as well as the good effect of the semiconductor material including Al on the breakdown voltage on the operation of the HBT for high power output. In other words, it is possible, according to the present embodiment, to realize an HBT having improved breakdown voltage on operation for high power output, while making full use of the advantageous characteristics of the InGaP/GaAs HBT with high performance and high reliability.

In addition, according to the HBT of the present embodiment, the base electrode 171 is formed on the second emitter layer 401 made of $In_xGa_{1-x}P$ so as to come in ohmic contact with the base layer 130. Therefore, it is possible, according to the present embodiment, to reduce the recombination current in the base, compared with the case where the base electrode is formed on the semiconductor layer made of a semiconductor material including Al at a high surface recombination rate so as to come in ohmic contact with the base layer, and thus to realize an HBT with high performance and high reliability.

Furthermore, according to the HBT of the present embodiment, the second emitter layer 401 is made of $In_xGa_{1-x}P$ and functions as a stopper layer for forming the emitter island. Therefore, it is possible, according to the present embodiment, to realize an HBT that allows etching with higher accuracy for forming the emitter island.

Third Embodiment

Figure 8:
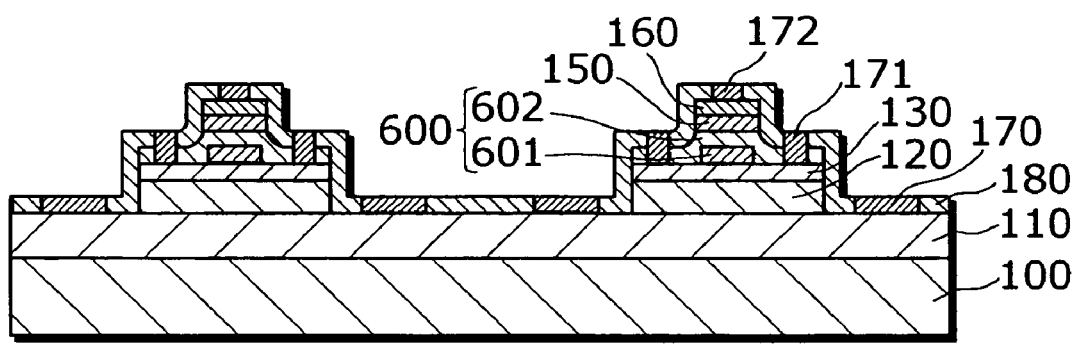
FIG. 8 is a cross-sectional view showing a structure of an HBT in a third embodiment of the present invention.

FIG. 8 is a cross-sectional view showing a structure of the HBT in the third embodiment. The same reference numbers are assigned to the same components as those in FIG. 3, and the detailed explanation thereof is not repeated here.

The HBT of the present embodiment has a multilayer structure including the following layers formed on the semiconductor substrate 100 in the following order: the sub-collector layer 110; the collector layer 120; the base layer 130; and an emitter layer 600; the emitter cap layer 150; and the emitter contact layer 160.

The emitter layer 600 includes a first emitter layer 601 and a second emitter layer 602, which is formed on the first emitter layer 601 and the base layer 130, covering the first emitter layer 601. Here, the first emitter layer 601 is a non-doped or n-type layer which is made of a semiconductor material including Al, while the second emitter layer 602 is an n-type layer, with the thickness of 20 to 50 nm, which is made of $In_xGa_{1-x}P$ including In composition of about 50%. Here, the semiconductor material including Al used for the first emitter layer 601 is an Al oxide, $Al_yGa_{1-y}As$ including Al composition of about 10 to 15%, or the like, for example.

Here, the thickness of the first emitter layer 601 shall be 10 nm or less because the first emitter layer 601 with the thickness of more than 10 nm has too much effect on the emitter layer 600, and thus has much adverse effect on the performance and reliability of the HBT due to increase in recombination current or the like. On the other hand, the thickness of the first emitter layer 601 shall be 3 nm or more because the first emitter layer 601 with the thickness of less than 3 nm has too little effect on the emitter layer 600, and thus has little good effect on the breakdown voltage on the operation of the HBT for high power output due to increase in recombination current or the like.

The collector electrode 170 is formed on the sub-collector layer 110, the base electrode 171 is formed on the second emitter layer 602 by diffusing thermally so as to come into contact with the base layer 130, and the emitter electrode 172 is formed on the emitter contact layer 160.

The insulating film 180 is formed on the exposed surface, where the electrodes are not formed, of the sub-collector layer 110, the collector layer 120, the base layer 130, the emitter layer 600, the emitter cap layer 150 and the emitter contact layer 160.

Next, a manufacturing method of the HBT with the structure as mentioned above will be explained below with reference to the cross-sectional views in FIG. 9A to FIG. 9F. It should be noted that the same reference numbers are assigned to the same components as those in FIG. 8, and the detailed explanation thereof is not repeated here.

Figure 9A:
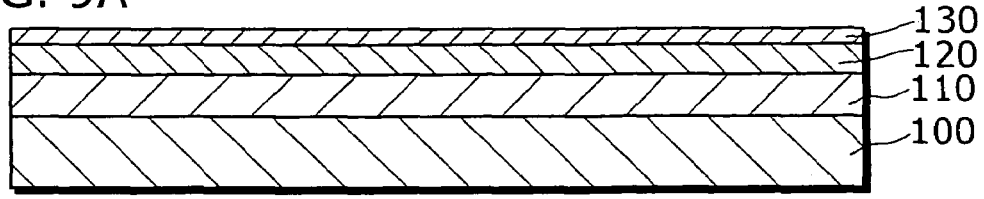
FIG. 9A to FIG. 9F are cross-sectional views for explaining a manufacturing method of the HBT in the third embodiment.

First, as shown in FIG. 9A, by a crystal growth method like the MBE method or the MOCVD method, the sub-collector layer 110, the collector layer 120 and the base layer 130 are laminated on the semiconductor substrate 100 in this order.

Figure 9B:
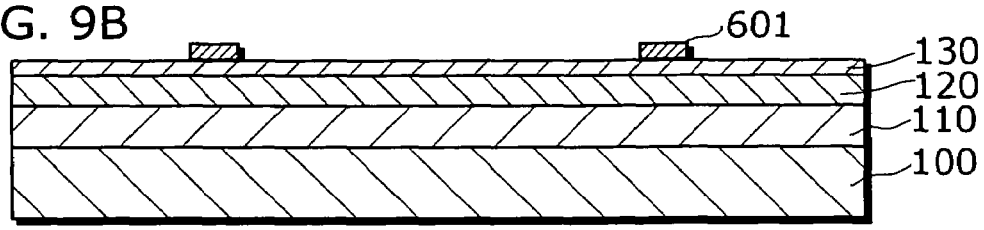

Next, as shown in FIG. 9B, after a pattern for forming the first emitter layer 601 is formed using a photoresist, the first emitter layer 601 is formed on the predetermined area of the base layer 130 where the emitter island is to be formed by the crystal growth method.

Figure 9C:
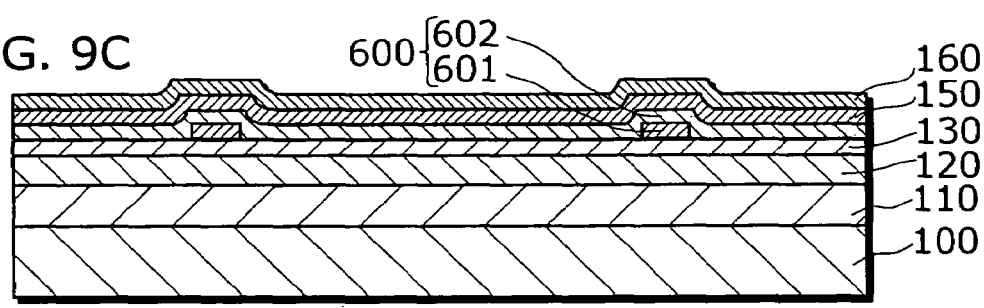

Next, as shown in FIG. 9C, by the crystal growth method, the second emitter layer 602, the emitter cap layer 150 and the emitter contact layer 160 are laminated in sequence on the base layer 130 and the first emitter layer 601.

Figure 9D:
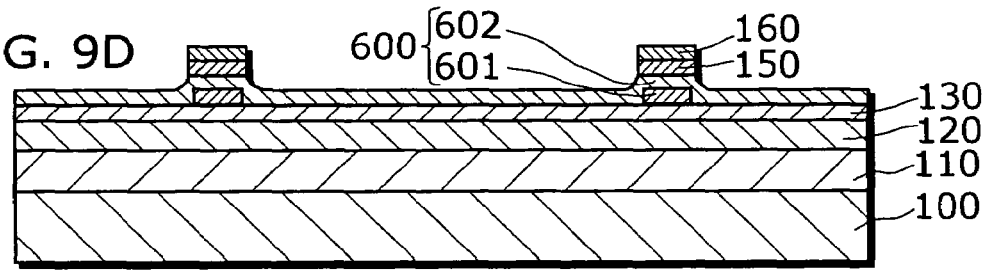

Next, as shown in FIG. 9D, after a pattern for forming the emitter island is formed using a photoresist, the emitter contact layer 160 and the emitter cap layer 150 are etched in sequence using a mixed solution of phosphoric acid, hydrogen peroxide and water, so as to form the emitter island. During this process, the second emitter layer 602 is hardly etched.

Figure 9E:
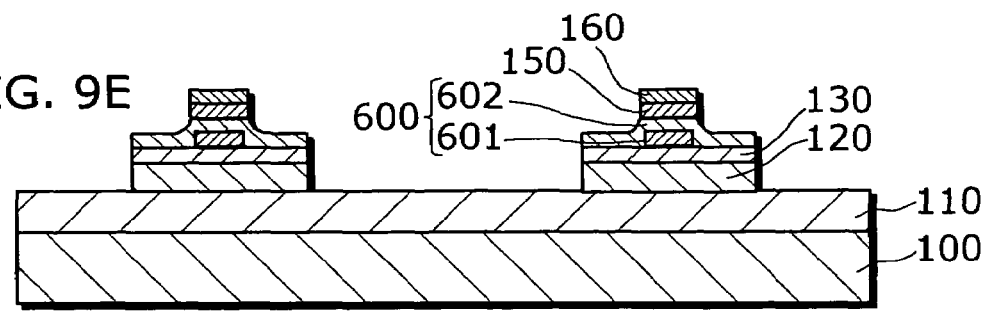

Next, as shown in FIG. 9E, after a pattern for forming the base island is formed using a photoresist, the second emitter layer 602 is selectively etched using hydrochloric acid diluted with water. Using the etched second emitter layer 602 as a mask, the base layer 130 and the collector layer 120 are etched in sequence by a mixed solution of phosphoric acid, hydrogen peroxide and water, so as to form the base island.

Figure 9F:
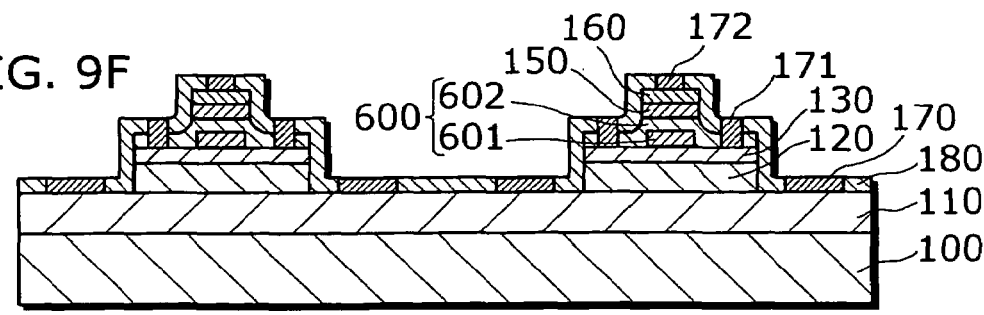

Next, as shown in FIG. 9F, after the insulating film 180 is deposited all over the surface, contact windows that correspond to the collector electrode 170, the base electrode 171 and the emitter electrode 172 are opened, and then, the electrode metals are formed in the respective windows. The HBT in the present embodiment is manufactured in this manner.

As described above, according to the HBT in the present embodiment, the emitter layer 600 includes the first emitter layer 601 which is made of a semiconductor material including Al and the second emitter layer 602 which is made of $In_xGa_{1-x}P$, and the thickness of the first emitter layer 601 is a range between 3 and 10 nm. Therefore, it is possible to make the best use of the good effect of the semiconductor material including Al on the breakdown voltage on the operation of the HBT for high power output, while suppressing to a minimum the adverse effect of the semiconductor material including Al on the performance and reliability of the HBT. In other words, it is possible, according to the present embodiment, to realize an HBT having improved breakdown voltage on operation for high power output, while making full use of the advantageous characteristics of the InGaP/GaAs HBT with high performance and high reliability.

In addition, according to the HBT in the present embodiment, the base electrode 171 is formed on the second emitter layer 602 which is made of $In_xGa_{1-x}P$ so as to come in ohmic contact with the base layer 130. Therefore, according to the present embodiment, it is possible to reduce the recombination current in the base, compared with the case where the base electrode is formed on the semiconductor layer made of $Al_yGa_{1-y}As$ at a high surface recombination rate so as to come in ohmic contact with the base layer, and thus to realize an HBT with high performance and high reliability.

Furthermore, according to the HBT of the present embodiment, the second emitter layer 602 is made of $In_xGa_{1-x}P$ and functions as a stopper layer for forming the emitter island. Therefore, it is possible, according to the present embodiment, to realize an HBT that allows etching with higher accuracy for forming the emitter island.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

INDUSTRIAL APPLICABILITY

The present invention is applicable to a heterojunction bipolar transistor, and particularly to an amplifying device or the like for a wireless communication terminal such as a cell phone.

What is claimed is:

1. A heterojunction bipolar transistor comprising:
an n-type collector layer made of GaAs;
a p-type base layer made of GaAs and formed on said collector layer;
an n-type or non-doped first emitter layer formed on said base layer,
an n-type second emitter layer formed on said first emitter layer; and
a base electrode formed on said base layer so as to contact at least one of said first emitter layer and said second emitter layer,
wherein said first emitter layer is made of a semiconductor material including aluminum, and has a thickness ranging from 3 nm to less than 10 nm,
wherein said second emitter layer is made of $In_xGa_{1-x}P$ ($0<x<1$),
wherein said base electrode is formed by thermally diffusing metal on at least one of said first emitter layer and said second emitter layer so that said base electrode contacts said base layer, and
wherein said first emitter layer is made of an aluminum oxide.

2. A heterojunction bipolar transistor comprising:
an n-type collector layer made of GaAs;
a p-type base layer made of GaAs and formed on said collector layer;
an n-type or non-doped first emitter layer formed on said base layer,
an n-type second emitter layer formed on said first emitter layer; and
a base electrode formed on said base layer so as to contact at least one of said first emitter layer and said second emitter layer,
wherein said first emitter layer is made of a semiconductor material including aluminum, and has a thickness ranging from 3 nm to less than 10 nm,
wherein said second emitter layer is made of $In_xGa_{1-x}P$ ($0<x<1$), and
wherein said first emitter layer is made of an aluminum oxide.

3. A heterojunction bipolar transistor comprising:
an n-type collector layer made of GaAs;
a p-type base layer made of GaAs and formed on said collector layer;
an n-type or non-doped first emitter layer formed on said base layer; and
an n-type second emitter layer formed on said first emitter layer; and
a base electrode formed on said base layer so as to contact at least one of said first emitter layer and said second emitter layer,
wherein said first emitter layer is made of a semiconductor material including aluminum,
wherein said second emitter layer is made of $In_xGa_{1-x}P$ ($0<x<1$),
wherein said base electrode is formed by thermally diffusing metal on at least one of said first emitter layer and said second emitter layer so that said base electrode contacts said base layer,
wherein said first emitter layer has a thickness ranging from 3 nm to less than 10 nm, and
wherein said first emitter layer is made of an aluminum oxide.

4. A heterojunction bipolar transistor comprising:
an n-type collector layer made of GaAs;
a p-type base layer made of GaAs and formed on said collector layer;
an n-type or non-doped first emitter layer formed on said base layer; and
an n-type second emitter layer formed on said first emitter layer; and
a base electrode formed on said base layer so as to contact at least one of said first emitter layer and said second emitter layer,
wherein said first emitter layer is made of a semiconductor material including aluminum,
wherein said second emitter layer is made of $In_xGa_{1-x}P$ ($0<x<1$),
wherein said base electrode is formed by thermally diffusing metal on at least one of said first emitter layer and said second emitter layer so that said base electrode contacts said base layer, and
wherein said first emitter layer is made of an aluminum oxide.

5. A heterojunction bipolar transistor comprising:
an n-type collector layer made of GaAs;
a p-type base layer made of GaAs and formed on said collector layer;
an n-type or non-doped first emitter layer formed on said base layer; and
an n-type second emitter layer formed on said first emitter layer; and
a base electrode formed on said base layer so as to contact at least one of said first emitter layer and said second emitter layer,
wherein said first emitter layer is made of a semiconductor material including aluminum,
wherein said second emitter layer is made of $In_xGa_{1-x}P$ ($0<x<1$), and
wherein said first emitter layer is made of an aluminum oxide.

* * * * *